United States Patent [19]
Ibok

[11] Patent Number: 6,051,478
[45] Date of Patent: Apr. 18, 2000

[54] METHOD OF ENHANCING TRENCH EDGE OXIDE QUALITY

[75] Inventor: Effiong E. Ibok, Sunnyvale, Calif.

[73] Assignee: Advanced Micro Devices, Inc., Sunnyvale, Calif.

[21] Appl. No.: 08/992,844

[22] Filed: Dec. 18, 1997

[51] Int. Cl.[7] .............................. H01L 49/00; H01L 21/76
[52] U.S. Cl. ..................... 438/424; 148/33.3; 438/296
[58] Field of Search ............................. 438/424, 296; 148/33.3

[56] References Cited

U.S. PATENT DOCUMENTS

| | | | |
|---|---|---|---|
| 4,374,011 | 2/1983 | Vora et al. ........................... | 438/424 |
| 5,712,185 | 1/1998 | Tsai et al. ............................ | 438/424 |
| 5,733,383 | 3/1998 | Fazan et al. ......................... | 438/424 |
| 5,780,346 | 7/1998 | Arghavani et al. ................. | 438/296 |

*Primary Examiner*—Charles Bowers
*Assistant Examiner*—David S Blum

[57] ABSTRACT

A shallow trench isolation structure is formed with a nitridated oxide liner on the sides and edges of the trench, thereby reducing interfacial strain. Embodiments include forming a trench opening in a monocrystalline silicon substrate or in an epitaxial layer formed thereon. An oxide liner is formed at the internal surface of the trench opening in a nitrous oxide ambience, creating flexible silicon-nitrogen (Si—N) bonds which relieves stress induced at the side walls and edges of the trench. The lined trench opening is then filled with an insulating material.

26 Claims, 2 Drawing Sheets

METHOD OF ENHANCING TRENCH EDGE OXIDE QUALITY

TECHNICAL FIELD

The present invention relates to manufacturing semiconductor devices with trench isolation and, more particularly, to manufacturing ultra large scale integration and high density semiconductor devices with submicron design features and active regions isolated by shallow insulated trenches.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional semiconductor technology for isolating active regions.

Conventional semiconductor devices comprise a substrate having various electrically isolated regions, called active regions, in which individual circuit components are formed. The active region typically includes source/drain regions of a transistor formed in the semiconductor substrate or epitaxial layer, spaced apart by a channel region. A gate electrode for switching the transistor is formed on the channel with a gate oxide layer therebetween. The quality and thickness of the gate oxide are crucial for the performance and reliability of the finished device.

The electrical isolation of these active regions is typically accomplished by defining field regions bounding the active regions, using a source/drain mask applied to a barrier nitride layer deposited over the semiconductor substrate, typically doped monocrystalline silicon or an epitaxial layer formed on a semiconductor substrate. The field oxide that isolates the active regions is typically formed by thermal oxidation.

For example, one type of isolation is known as Local Oxidation Of Silicon (LOCOS), in which the entirety of the field oxide is formed by heating the substrate with the field regions exposed to an oxidizing gas, such as oxygen or water vapor. LOCOS methodology, however, disadvantageously results in the formation of a field oxide region having tapering edges, because the oxidizing species for forming the field oxide diffuses horizontally once it has penetrated the substrate. This tapering end portion resembles and, therefore, is commonly referred to as, a "bird's beak."

LOCOS methodology is thus subject to several inherent problems. For example, while the horizontal extent of the bird's beak can be loosely controlled by the stress induced in the masking layers adjacent to the field, this same stress can cause strain defects in the active areas including point defects, dislocations, stacking faults, as well as catastrophic failures such as delamination, particle generation, etc. Moreover, the aggressive scaling of gate electrode dimension into the deep submicron regime, such as less than about 0.25 microns, requires tighter source/drain region to source/drain region spacing, which is adversely affected by the bird's beak attendant upon LOCOS methodology.

Another type of isolation is known as shallow trench isolation (STI). This form of isolation is typically accomplished by etching a trench in the substrate, conducting a thermal oxidation step to grow an oxide liner on the trench walls to control the silicon-silicon dioxide interface quality, and filling the lined trench with an insulating material, such as silicon dioxide derived from tetraethyl orthosilicate (TEOS). The surface is then planarized, as by chemical-mechanical polishing (CMP), to complete the trench isolation structure.

A typical trench isolation structure thus comprises an internal surface with side surfaces extending into the substrate (or epitaxial layer) with edges at the main surface of the substrate and at the bottom of the trench. Due to "reentrance" of the side walls, which occurs when the side walls expand inwardly and vertically align during the oxidation of the liner oxide, stress is disadvantageously induced at the side walls of the trench. Reentrance is further exacerbated in the deep submicron regime, since the greater aspect ratio of the isolation trenches leads to more vertical side walls. When the trench is later exposed to higher temperatures, for example, to round the edges of the liner oxide, the stress induced at the side walls is transmitted to the active regions of the substrate. As a result, the quality of the gate oxide over the stressed active regions is degraded, adversely affecting the performance of the finished device.

DISCLOSURE OF THE INVENTION

There exists a continuing need for shallow trench isolation methodology wherein the resulting gate oxide layer at the trench edges exhibits high reliability. There is a need for reducing the stress induced at the side walls of the isolation trenches, especially for deep submicron geometries.

These and other needs are met by the present invention, in which the liner oxide is grown in a nitrous oxide ($N_2O$) ambience. The nitrous oxide ambience nitrates the liner oxide and causes the formation of silicon-nitrogen (Si—N) bonds, relieving stress at the side walls of the trench.

Additional needs, objects, advantages, and other features of the present invention will be set forth in part in the description which follows and in part will become apparent to those having ordinary skill in the art upon examination of the following or may be learned from the practice of the invention. The needs, objects, and advantages of the present invention may be realized and obtained as particularly pointed out in the appended claims.

Accordingly, one aspect of the invention is a method of manufacturing a semiconductor device comprising: forming a trench in a semiconductor substrate or an epitaxial layer formed on a semiconductor substrate, said trench having an internal surface including side surfaces intersecting a main surface of the substrate or epitaxial layer; growing a trench oxide liner on the internal surface of the trench and trench edges by nitriding in an atmosphere containing nitrous oxide ($N_2O$); and subsequently filling the trench with an insulating material.

Another aspect of the invention is a method of manufacturing a semiconductor device comprising: forming a trench in a semiconductor substrate or an epitaxial layer on a semiconductor substrate, said trench having an internal surface including side surfaces intersecting a main surface of the substrate or epitaxial layer; oxidizing the internal surface and edges of the trench to form a base oxide liner having a thickness of about 30 Å to about 35 Å at a temperature of about 900° C. to about 950° C.; nitriding the base oxide liner in an atmosphere containing nitrous oxide to form a nitrogen-rich oxide liner having a thickness of about 50 Å to 60 Å at a temperature of less than about 950° C. and containing about 1.5 at. % to about 2.0 at. % nitrogen; oxidizing the nitrogen-rich liner to form a trench oxide liner having a thickness of at least about 500 Å at a temperature of about 950° C. to about 1,100° C.; and subsequently filling the trench with an insulating material.

Another aspect of the invention is a semiconductor device having an active region isolated by an insulating trench. The insulating trench comprises: an opening formed in a semiconductor substrate or in an epitaxial layer formed on a semiconductor substrate, said opening having an internal surface with side surfaces intersecting a main surface of the semiconductor substrate or epitaxial layer at edges; a thermally grown oxide liner containing nitrogen on the internal surface and trench edges; and an insulating material filling said opening.

Additional needs, objects, and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

The present invention addresses and solves problems associated with conventional shallow trench isolation (STI) methodology, wherein reentrance and stress are induced at the side walls and edges of an isolation trench. Accordingly, the liner oxide at the internal surface of the trench is grown in a nitrous oxide (N$_2$O) ambience. The nitrous oxide ambience causes the formation of silicon-nitrogen (Si—N) bonds in the liner oxide, relieving stress at the side walls and edges of the trench.

Figure 1A:
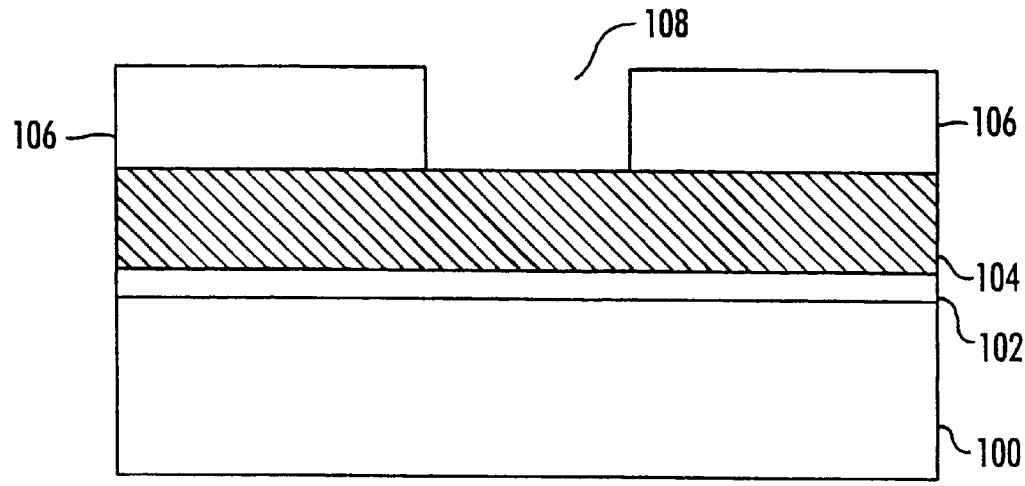
FIGS. 1A through 1F schematically illustrate sequential phases manufacturing an isolation trench structure according to an embodiment of the present invention.

An embodiment of the present invention is schematically illustrated in FIGS. 1A through 1G, wherein similar elements bear similar reference numerals. Referring to FIG. 1A, a substrate 100 is prepared, typically a semiconductor substrate comprising doped monocrystalline silicon or an epitaxial layer formed on a silicon substrate in accordance with conventional practices. A pad oxide layer 102 is then formed on substrate 100. Pad oxide layer 102 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Subsequently, a nitride layer 104 is deposited on silicon oxide pad layer 102, such as a silicon nitride layer by CVD. Silicon oxide pad layer 102 functions as a buffer layer cushioning stresses between substrate 100 and silicon nitride layer 104. Silicon nitride layer 104 functions as an oxidation mask because it is resistant to the diffusion of oxygen and water vapor therethrough, thereby preventing an oxidizing species from reaching the underlying silicon substrate. A photoresist mask 106 is formed upon the deposited silicon nitride layer 104 having a pattern defined, e.g., by opening 108, typically having a width substantially corresponding to the width of the subsequently formed trench, such as less than about 0.375 micron, e.g., less than about 0.25 micron.

Figure 1B:
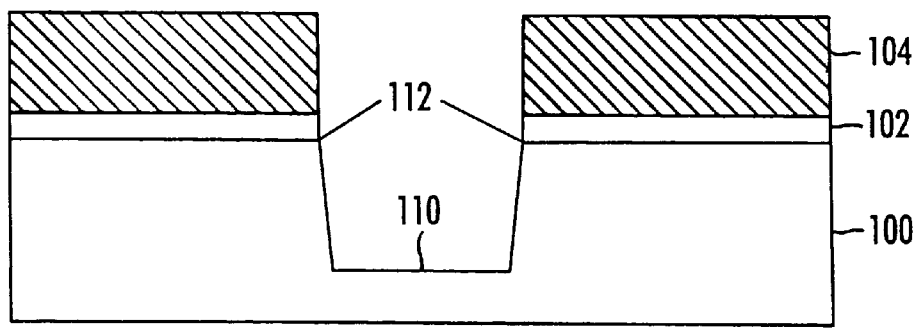

Referring to FIG. 1B, anisotropic etching is then conducted, to form trench 110, typically having a width substantially corresponding to the width of opening 108 in photoresist mask 106. Trench 110 has an internal surface defined, In part, by side surfaces 140 which are vertically sloped, e.g. at an angle of about 70° to about 75°, intersecting the main surface of the substrate at edges 112. Trench 110 may be etched to a depth of about 2000 Å to about 4000 Å. For example, a depth such as about 3000 Å has been found to be particularly suitable. Photoresist 106 is then stripped.

Figure 1C:
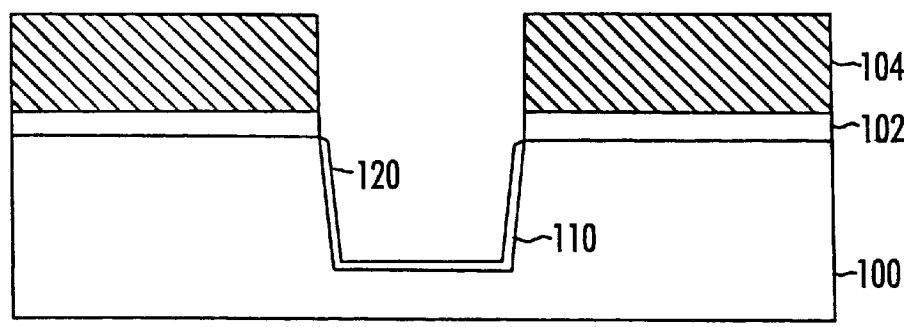

Referring to FIG. 1C, a nitrogen-rich oxide liner 120 is thermally grown on the internal surface of trench 110 and edges In an atmosphere containing nitrous oxide (N$_2$O). In an embodiment of the present invention, a thin layer of a base oxide (not shown) is initially grown by oxidation. Although the base oxide liner is not necessary in an embodiment of the present invention for to insure the structural integrity of the trench, it has been found to improve electrical qualities of the isolation structure, such as charge distribution at the silicon interface. The base oxide liner may be grown at an appropriate temperature such as less than about 950° C., e.g., 900° C., for a short period of time, such as about five (5) minutes, in a dry, oxygen ambient. The resulting base oxide liner may have a thickness of about 30 Å to about 35 Å.

The base oxide liner is then nitrided, as at a temperature less than about 950° C. for up to about thirty (30) minutes in an atmosphere containing N$_2$O at flow rate of about 100% down to about 20%. The nitriding gaseous atmosphere may comprise additional components such as nitrogen (N$_2$) and insert gases such as argon (Ar). Due to the nitration, the oxide liner grows to a thickness of about 50 Å to about 60 Å and contains about 1.5 at. % to 2.0 at % nitrogen.

Nitration causes the formation of additional amounts of silicon dioxide at the silicon interface as well as various forms of silicon nitride. The Si—N bonds in silicon nitride are more flexible than the Si-O bonds in the silicon oxide and are, accordingly, less likely to release stress due to reentrance or vertical alignment when exposed to high temperatures, e.g. in an edge-rounding oxidation step. Consequently, stress transmitted to the active regions is significantly reduced, thereby improving the quality of the gate oxide layer and, hence, yield and reliability.

Figure 1D:
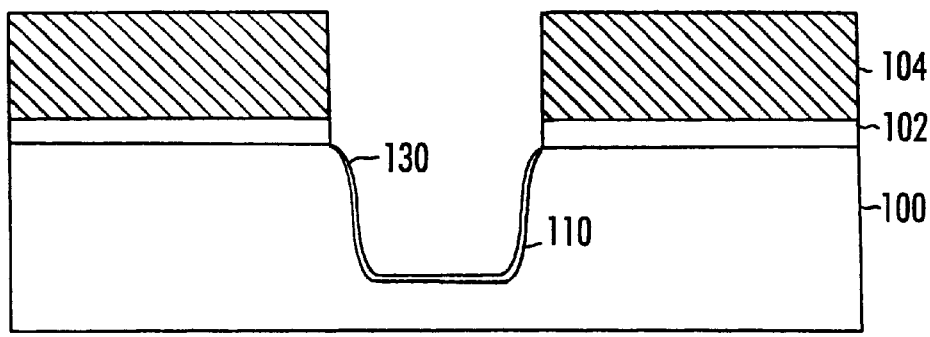

Referring to FIG. 1D, the nitrogen-rich oxide liner is further grown by oxidation to form a thicker trench oxide liner 130, e.g. at a thickness of about 500 Å to about 1000 Å, preferably about 500 Å. It has been observed that while some portion of the nitrogen in the nitrogen-rich oxide liner is spread out through the newly grown oxide, a large concentration thereof remains at the silicon interface at the side walls and edges of the trench.

This oxidation step is called "edge-rounding" oxidation, because edges in the oxide liner become rounded reducing stress at the corners. The edge-rounding step is carried out in an oxygen (O$_2$) containing atmosphere at temperatures higher than those employed during nitration, e.g. about 950° C. to about 1100° C. The length of time the edge-rounding oxidation is performed depends on the ambient temperature. For example, at 950° C., the edge-rounding oxidation can be performed for about two (2) to about three (3) hours. However, at 1,100° C., the edge-rounding oxidation can be performed for only about ten (10) minutes. Alternatively, wet oxidation, with water vapor as the oxidizing species, may be employed.

Conventionally, the lower but slower edge-rounding oxidation temperature of about 950° C. was adopted in order to avoid the stress induced at the side walls at the higher temperatures. With the present invention, however, throughput can be improved by employing faster but higher edge-rounding temperatures, e.g. 1100° C., because the side wall stress, which was conventionally problematic at the higher temperatures, is relieved by nitridating the trench oxide liner.

Figure 1E:
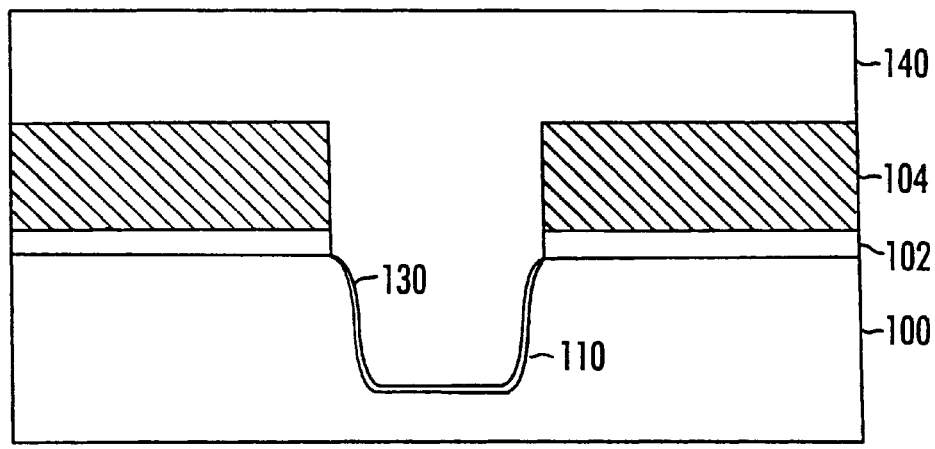
Figure 1F:
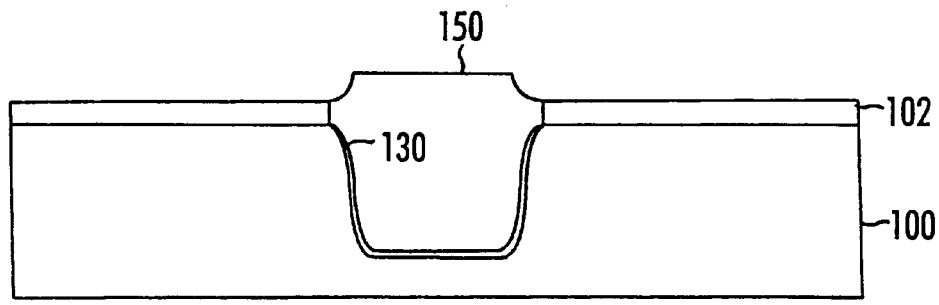

The trench isolation structure is completed by filling the trench 110 with a suitable insulation material 140, as illustrated in FIG. 1E. Such insulating material can comprise silicon dioxide derived from TEOS by LPCVD or derived from silane by LPCVD. Alternatively, the trench can be filled with a high density plasma (HDP) oxide, employing the methodology disclosed in the commonly-assigned, copending application Ser. No. 08/924,133, filed Sep. 7, 1997, (Our Docket No. 1033-352). Referring to FIG. 1F, subsequent to trench filling, planarization is effected and the nitride layer is stripped, resulting in a substantially flat surface 150.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices having a design rule less than about 0.375 micron, including less than about 0.25 micron.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an active region isolated by an insulated trench, said method comprising:

forming a trench in a semiconductor substrate or an epitaxial layer formed on a semiconductor substrate, said trench having an internal surface including side surfaces intersecting a main surface of the substrate or epitaxial layer;

growing a nitrogen-rich oxide liner on the internal surface of the trench and trench edges by nitriding in an atmosphere containing nitrous oxide ($N_2O$);

oxidizing the nitrogen-rich oxide liner to form a trench oxide liner; and subsequently filling the trench with an insulating material.

2. The method of claim 1, further comprising:

oxidizing the internal surface of the trench to form a base oxide liner before growing the nitrogen-rich oxide liner.

3. The method of claim 2, comprising growing the base oxide liner to a thickness of about 30 Å to about 35 Å.

4. The method of claim 3, comprising growing the base oxide liner at a temperature of about 900° C. to about 950° C.

5. The method of claim 1, wherein the nitrogen-rich oxide liner contains about 1.5 at. % to about 2.0 at. % nitrogen.

6. The method of claim 1, wherein the nitrogen-rich liner oxide has a thickness of about 50 Å to about 60 Å.

7. The method of claim 6, wherein the nitrous oxide atmosphere contains at least about 20% nitrous oxide.

8. The method of claim 7, wherein the atmosphere contains nitrogen ($N_2$) or argon (Ar).

9. The method of claim 7, comprising forming the nitrogen-rich oxide liner a temperature less than about 950° C.

10. The method of claim 9, comprising nitriding the trench opening for at most about thirty (30) minutes.

11. The method of claim 1, wherein the trench oxide liner has a thickness of about 500 Å to about 1000 Å.

12. The method of claim 11, wherein the trench oxide liner has a thickness of about 500 Å.

13. The method of claim 11, comprising oxidizing the nitrogen-rich oxide liner at a temperature of about 950° C. to about 1,100° C.

14. The method of claim 13, comprising oxidizing the trench oxide liner at a temperature of about 1,100° C.

15. The method of claim 1, comprising:

forming a pad oxide layer on a main surface of the semiconductor substrate or epitaxial layer formed on a semiconductor substrate;

forming a nitride layer on the pad oxide layer; and etching to remove portions of the nitride layer and the pad oxide layer forming said trench.

16. The method of claim 15, wherein said pad oxide layer comprises a silicon oxide and said nitride layer comprises silicon nitride.

17. The method of claim 15, comprising providing a mask on said nitride layer, said mask containing a pattern having an opening with a dimension substantially equal to a dimension of said trench.

18. The method of claim 17, wherein said mask comprises a photoresist mask.

19. The method of claim 15, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

20. The method of claim 19, comprising planarizing a main surface by chemical-mechanical polishing.

21. The method of claim 1, comprising rounding the trench edges during said oxidizing the nitrogen-rich oxide liner to form the trench oxide liner.

22. The method of claim 1, comprising performing said oxidizing the nitrogen-rich oxide liner to form the trench oxide liner for about ten (10) minutes.

23. A method of manufacturing a semiconductor device having an active region isolated by an insulated trench, said method comprising:

forming a trench in a semiconductor substrate or an epitaxial layer on a semiconductor substrate, said trench having an internal surface including side surfaces intersecting a main surface of the substrate or epitaxial layer;

oxidizing the internal surface and edges of the trench to form a base oxide liner having a thickness of about 30 Å to about 35 Å at a temperature of about 900° C. to about 950° C.;

nitriding the base oxide liner in an atmosphere containing nitrous oxide to form a nitrogen-rich oxide liner having a thickness of about 50 Å to 60 Å at a temperature of less than about 950° C. and containing about 1.5 at. % to about 2.0 at. % nitrogen;

oxidizing the nitrogen-rich liner to form a trench oxide liner having a thickness of at least about 500 Å at a temperature of about 950° C. to about 1,100° C.; and subsequently filling the trench with an insulating material.

24. The method of claim 23, comprising rounding the trench edges during said oxidizing the nitrogen-rich liner to form the trench oxide liner.

25. The method of claim 23, comprising performing said oxidizing the nitrogen-rich liner to form the trench oxide liner for about ten (10) minutes.

26. The method of claim 23, comprising performing said oxidizing the nitrogen-rich liner to form the trench oxide liner at a temperature of about 1,100° C.

* * * * *